(12) United States Patent
Shimada et al.

(10) Patent No.: US 9,541,578 B2
(45) Date of Patent: Jan. 10, 2017

(54) CAPACITIVE SENSOR SHEET PRODUCING METHOD AND CAPACITIVE SENSOR SHEET

(75) Inventors: Satoshi Shimada, Saitama (JP); Hiroto Komatsu, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 417 days.

(21) Appl. No.: 14/112,176

(22) PCT Filed: Apr. 20, 2012

(86) PCT No.: PCT/JP2012/060748
§ 371 (c)(1),
(2), (4) Date: Oct. 16, 2013

(87) PCT Pub. No.: WO2012/147659
PCT Pub. Date: Nov. 1, 2012

(65) Prior Publication Data
US 2014/0035599 A1   Feb. 6, 2014

(30) Foreign Application Priority Data

Apr. 25, 2011 (JP) ................................. 2011-096985
Apr. 17, 2012 (JP) ................................. 2012-093534

(51) Int. Cl.
*G01R 27/26* (2006.01)
*G01R 3/00* (2006.01)
*G06F 3/044* (2006.01)

(52) U.S. Cl.
CPC ............. *G01R 3/00* (2013.01); *G01R 27/2605* (2013.01); *G06F 3/044* (2013.01); *G06F 2203/04103* (2013.01); *Y10T 29/49162* (2015.01)

(58) Field of Classification Search
CPC ....... G06F 3/044; G01R 27/2605; G01R 3/00; H01G 4/005
See application file for complete search history.

(56) References Cited

U.S. PATENT DOCUMENTS 7,990,481 B2 *   8/2011  Hur ....................... G06F 3/0412
                                                      345/173
2002/0094617 A1 *  7/2002  Taniguchi ............... H01L 28/91
                                                      438/171

(Continued)

FOREIGN PATENT DOCUMENTS

JP    2006-513557 A    4/2006
JP    2009-146421 A    7/2009

(Continued)

OTHER PUBLICATIONS

International Search Report issued in PCT/JP2012/060748 mailed on Jul. 24, 2012 (2pages).

*Primary Examiner* — Jermele M Hollington
*Assistant Examiner* — Demetrius Pretlow
(74) *Attorney, Agent, or Firm* — Osha Liang LLP

(57) ABSTRACT

A capacitive sensor sheet producing method for producing a capacitive sensor sheet uses a base having an insulative base layer on which a binder resin layer including conductive nanowires is formed. The conductive nanowires partially projecting from a surface of the binder resin layer. The method includes removing a binder resin from projections of conductive nanowires partially projected from a plurality of detection electrodes by implementing a surface etching and shaping treatment on a surface of the binder resin layer, or surface ends of at least partial detection electrodes of the plurality of detection electrodes, forming wiring lines of the conductive pattern layer, and connecting the wiring lines to the surface ends of at least partial detection electrodes in the pattern layer. The projections of the conductive nanowires (Continued)

removed the binder resin are put into contact with the connecting portions.

11 Claims, 7 Drawing Sheets

(56) References Cited

U.S. PATENT DOCUMENTS

| 2003/0013233 | A1* | 1/2003 | Shibata | H01L 21/6835 438/114 |
|---|---|---|---|---|
| 2007/0070047 | A1* | 3/2007 | Jeon | G06F 3/0412 345/173 |
| 2010/0068461 | A1* | 3/2010 | Wallace | B81C 1/00111 428/156 |
| 2013/0062736 | A1* | 3/2013 | Brighton | H01L 21/76898 257/621 |
| 2014/0267107 | A1* | 9/2014 | Gaynor | H01B 1/16 345/173 |

FOREIGN PATENT DOCUMENTS

| JP | 2010-027294 A | 2/2010 |
|---|---|---|
| JP | 2010-044968 A | 2/2010 |
| JP | 2010-049618 A | 3/2010 |
| JP | 2010-086385 A | 4/2010 |
| JP | 2010-140859 A | 6/2010 |

\* cited by examiner

CAPACITIVE SENSOR SHEET PRODUCING METHOD AND CAPACITIVE SENSOR SHEET

TECHNICAL FIELD

The present invention relates to a capacitive sensor sheet for use in controlling, for example, audio devices, automobile-mounted devices and the like, as well as a capacitive sensor sheet producing method.

BACKGROUND ART

A conventional capacitive sensor sheet is assembled as a control means to an automobile-mounted device, including unillustrated first and second bases opposing, and adhering to, each other, the first base being formed with a conductive X-pattern layer, and the second base being formed with a conductive Y-pattern layer, and functions to detect a change of capacitance when a user's finger being a conductor approaches a selected point of the X-pattern layer and/or Y-pattern layer, and output the detection to a control device, to thereby contribute to the operation of the automobile-mounted device (see Patent Documents 1, 2, 3, 4 and 5).

The first and second bases each include an insulative base layer, a binder resin layer including silver nanowires laminated on the surface of the base layer, and are adhered and fixed to each other by an insulative adhesive sheet. The first and second bases each have an elongate tail section at the rear periphery of the base layer, so that these tail sections are connected to the control device.

The binder resin layer of the first base is formed by applying a binder resin solution with silver nanowires dispersed therein, on the surface of the base layer and then drying and curing, forming part of the X-pattern layer. The binder resin layer of the second base is formed by applying a binder resin solution with silver nanowires dispersed therein, on the surface of the base layer and then drying and curing, forming part of the Y-pattern layer.

The X-pattern layer is formed by arranging lines of a plurality of X-detection electrodes that are aligned in one row in the Y-direction on the surface of the base layer of the first base, abreast in the X-direction with a predetermined pitch. Conductive wiring lines are laid over and electrically connected to the surface of the terminal X-detection electrodes among the plurality of X-detection electrodes aligned in the Y-direction. The wiring line is extended to the tail section of the first base and electrically connected to the control device.

Each X-detection electrode is formed in an approximate diamond shape and functions to detect a change of capacitance when a user's finger approaches. The thus configured X-pattern layer is formed with the plurality of X-detection electrodes by etching and shaping the binder resin layer of the first base while the surface of the base layer of the first base is printed with silver paste, and then dried and cured to form a plurality of wiring lines.

The Y-pattern layer is formed by arranging lines of a plurality of Y-detection electrodes that are aligned in one row in the X-direction on the surface of the base layer of the second base, abreast in the Y-direction with a predetermined pitch. Conductive wiring lines are laid over and electrically connected to the surface of the terminal Y-detection electrodes among the plurality of Y-detection electrodes aligned in the X-direction. This wiring line is extended in the tail section via a through-hole and electrically connected to the control device.

Each Y-detection electrode is formed in an approximate diamond shape and detects a change of capacitance when a user's finger approaches. Similarly to the X-pattern layer, the thus configured Y-pattern layer is formed with the plurality of Y-detection electrodes by etching and shaping the binder resin layer of the second base while the surface of the base layer of the second base is printed with silver paste, and then dried and cured to form a plurality of wiring lines.

PRIOR ART DOCUMENTS

Patent Documents

Patent Document 1:
 Japanese Patent Application Laid-open 2010-86385
Patent Document 2:
 Japanese Patent Application Laid-open 2010-49618
Patent Document 3:
 Japanese Patent Application Laid-open 2010-44968
Patent Document 4:
 Japanese Patent Application Laid-open 2010-140859
Patent Document 5:
 Japanese Patent Application Disclosure 2006-513557

SUMMARY OF THE INVENTION

Problems to be Solved by the Invention

The capacitive sensor sheet in the prior art is thus constructed. The silver nanowires dispersed in the binder resin layer are used for electric conduction. However, in some cases the silver nanowires cannot not be projected or exposed from the binder resin layer due to thick overcoating of the binder resin layer; in other cases, not a little amount of the binder resin of the binder resin layer may adhere on the surface of the silver nanowires to form an insulative membrane. If, in such a situation, the X-detection electrodes or the Y-detection electrodes are simply formed using the binder resin layer, there occurs the problem that the electric conductivity in the connected part between the terminal X-detection electrode or Y-detection electrode and the wiring line degrades, whereby it is impossible to secure high enough conductivity.

The present invention has been devised in view of the above, it is therefore an object of the present invention to provide a capacitive sensor sheet producing method and a capacitive sensor sheet which can enhance electric conductivity, at least, in the connected part between detection electrodes and wiring lines, in the pattern layer.

Means for Solving the Problems

In order to solve the above problem, the present invention provides a capacitive sensor sheet producing method for producing a capacitive sensor sheet by using a base having an insulative base layer on which a binder resin layer including conductive nanowires is formed, the conductive nanowires partially projecting from a surface of the binder resin layer, comprising the steps of:

when a plurality of detection electrodes of a conductive pattern layer are formed by shaping a binder resin layer of a base, removing a binder resin from projections of conductive nanowires partially projected from the detection electrodes by implementing a surface etching and shaping treatment on a surface of the binder resin layer, or surface ends of at least partial detection electrodes of the plurality of detection electrodes;

forming wiring lines of the conductive pattern layer by applying a conductive material on a base layer of the base and drying and curing the applied conductive material; and, connecting the wiring lines to the surface ends of at least partial detection electrodes in the pattern layer, wherein the projections of the conductive nanowires removed the binder resin are put into contact with the connecting portions.

Here, the surface etching and shaping treatment may be carried out by either a dry etching method or a wet etching method.

Also, the surface etching and shaping treatment may be carried out by either plasma treatment technique, ultraviolet ray treatment technique, or corona treatment technique.

Further, a surface of all the detection electrodes in the pattern layer may be subjected to the surface etching and shaping treatment.

Also, a surface of the detection electrodes to be connected to the wiring lines may be subjected to the surface etching and shaping treatment.

In order to solve the above problem, the present invention provides a configuration having a conductive pattern layer formed on an insulative base layer and detecting a change in capacitance when a conductor approaches a detection electrode in the pattern layer, wherein the pattern layer includes:
a plurality of detection electrodes arrayed on the base layer; and
wiring lines formed on the base layer and connected to the plurality of detection electrodes, and the plurality of detection electrodes is formed by forming a binder resin layer including conductive nanowires on the base layer and shaping the binder resin layer so that the conductive nanowires are partially projected from a surface of the binder resin layer, and,
a binder resin is removed from projections of the conductive nanowires partially projected from the detection electrodes by implementing a surface etching and shaping treatment on at least surface ends of the detection electrodes to which the wiring lines are connected in the pattern layer, and the projections of the conductive nanowires removed the binder resin are put into contact with connecting portions between the detection electrodes and the wiring lines.

Here, the surface etching and shaping treatment may be carried out by either a dry etching method or a wet etching method.

Also, the surface etching and shaping treatment may be carried out by either plasma treatment technique, ultraviolet ray treatment technique, or corona treatment technique.

Further, a surface of all the detection electrodes of the pattern layer may be subjected to the surface etching and shaping treatment.

Also, the surface of the detection electrodes to be connected to the wiring lines may be subjected to the surface etching and shaping treatment.

Moreover, it is possible that the base layer is formed of a pair of base layers opposing, and adhering to, each other, one base layer being formed with an X-pattern layer to array a plurality of X-detection electrodes in the X-direction, the other base layer being formed with a Y-pattern layer to array a plurality of Y-detection electrodes in the Y-direction, and at least surface ends of terminal X-detection electrodes which the wiring lines are laid over and connected to, among the plurality of X-detection electrodes in the X-pattern layer, are subjected to the surface etching and shaping treatment while at least surface ends of terminal Y-detection electrodes which the wiring lines are laid over and connected to, among the plurality of Y-detection electrodes in the Y-pattern layer, are subjected to the surface etching and shaping treatment.

Herein, the number of bases and base layers in the scope of claims may be singular or plural. The binder resin layer is subjected to the surface etching and shaping treatment, at least in part of the surface before or after being shaped into the plurality of detection elements. The pattern layer may be subjected to the surface etching and shaping treatment, in, at least, the surface ends of detection electrodes to which wiring lines are connected; the surface of the detection electrodes to which wiring lines are connected and/or their peripheral area, or the surface of all the detection electrodes and/or their peripheral area may be subjected to the surface etching and shaping treatment.

The surface end of the detection electrode indicates the end in the surface, but does not means an end of a plane perpendicular to the surface, or so-called edge. The detection electrode preferably has a diamond shape which enables efficient use of space. However, this does not particularly mean exclusion of circular, rectangular, polygonal and other shapes in a plan view. Further, the method of realizing the surface etching and shaping treatment may employ various kinds of dry etching techniques and wet etching techniques.

According to the present invention, by subjecting at least the end part of the detection electrode surface to which the wiring lines are connected, to the surface etching and shaping treatment, the conductive nanowires partly projected from the detection electrode come into electric contact with the connecting portion between the detection electrode and the wiring line as auxiliary electrodes because the insulative binder resin adhering to the projections is removed so as to secure conduction. Accordingly, the conductivity in the connecting portion between the detection electrode and the wiring line is improved.

Advantages of the Invention

According to the present invention, since the binder resin on the projections of the conductive nanowires projected from the detection electrode is removed, it is possible to improve the conductivity in, at least, the connecting portion between the detection electrode and the wiring line, in the pattern layer.

According to the invention of Claim 2 or Claim 7, use of the dry etching technique for the surface etching and shaping treatment makes it possible to save time and labor for disposal of the etching liquid and masking, it is hence possible to improve operativity as well as to expect fine shaping of the detection electrodes. On the other hand, when the wet etching technique is adopted, since the selection ratio is high compared to the dry etching techniques, it is possible to improve economical efficiency.

According to the invention of claim 3 or claim 8, since the surface etching and shaping is performed by using the plasma treatment technique, ultraviolet ray treatment technique or corona treatment technique, it is possible to prevent unnecessary damage to the detection electrodes, and enhance the speed of operation. Further, use of the plasma treatment technique can enhance the activity effect of the detection electrode surface, makes the fine process simple and enables precision cleaning.

In processing with the ultraviolet ray treatment technique, the configuration of the ultraviolet ray irradiating device is relatively simple compared to other devices, so that it is possible to easily maintain and manage the device and prevent the detection electrodes from being adversely affected by heat. Further, in processing with the corona treatment technique, it is possible to keep the process clean and improve adhesion.

Further, according to the invention of claim 4 or claim 9, since the surface of all the detection electrodes is subjected to the surface etching and shaping treatment, it is possible to omit resist masking, to thereby simplify and accelerate the job without the necessity of adding any new step.

Moreover, according to the invention of claim 5 or claim 10, since the surface of the detection electrodes connected to wiring lines are subjected to the surface etching and shaping treatment, it is possible to prevent the conductive nanowires from being exposed, hence expect protect the conductive nanowires from corrosion.

MODE FOR CARRYING OUT THE INVENTION

Figure 1:
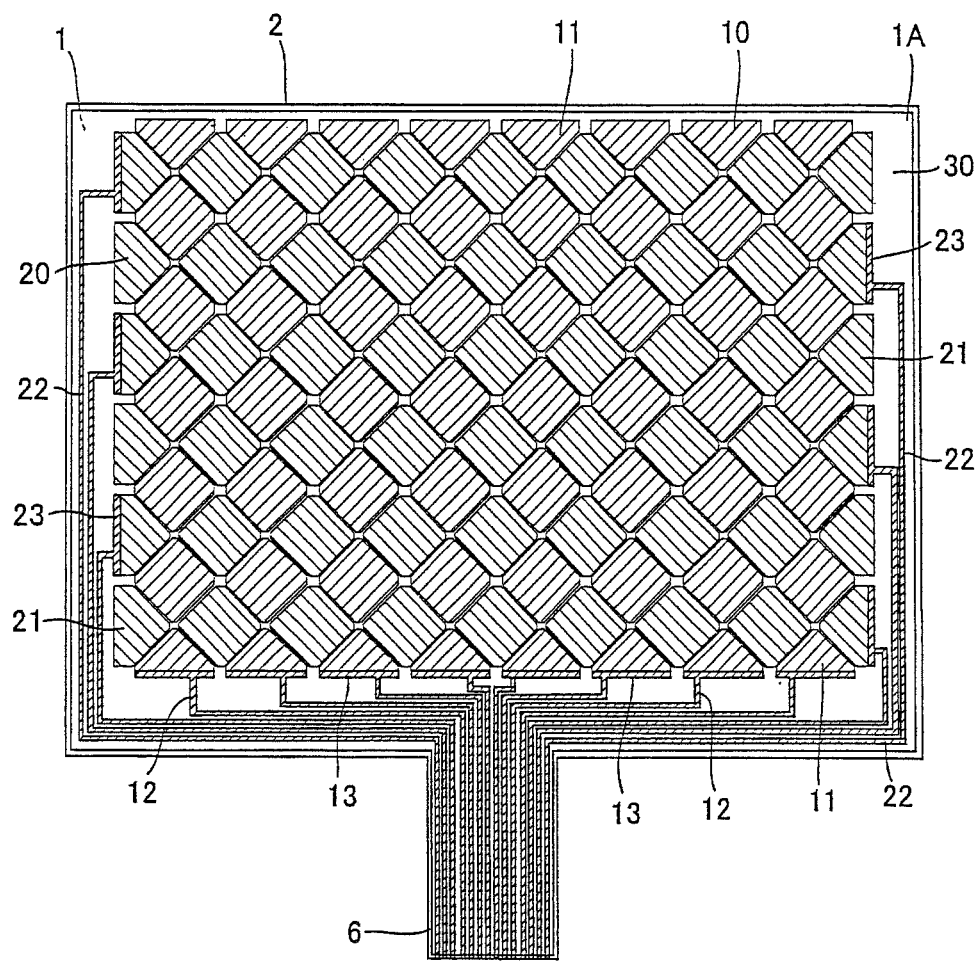
FIG. 1 is an illustrative plan view schematically showing an embodiment of a capacitive sensor sheet according to the present invention.

Next, the embodiment of the present invention will be described with reference to the drawings. As shown in FIGS. 1 through 8, the capacitive sensor sheet of the present embodiment is a sensor sheet having a conductive X-pattern layer 10 and a Y-pattern layer 20 respectively formed on first and second bases 1 and 1A opposing, and adhering to, each other to detect a change of capacitance when a finger approaches these X-detection electrodes 11 and/or Y-detection electrodes 21. In the capacitive sensor sheet, at least, the X-detection electrodes 11 and Y-detection electrodes 12 that are connected to wiring lines 12 and 22, in X-pattern layer 10 and Y-pattern layer 20 are processed by a surface etching and shaping treatment to thereby remove binder resin 7 of silver nanowires 4 projecting from the X-detection electrodes 11 and Y-detection electrodes 21 so that the silver nanowires 4 are brought into contact with connecting portion 13 or 23 between X-detection electrode 11 or Y-detection electrode 21 and wiring line 12 or 22.

Figure 2:
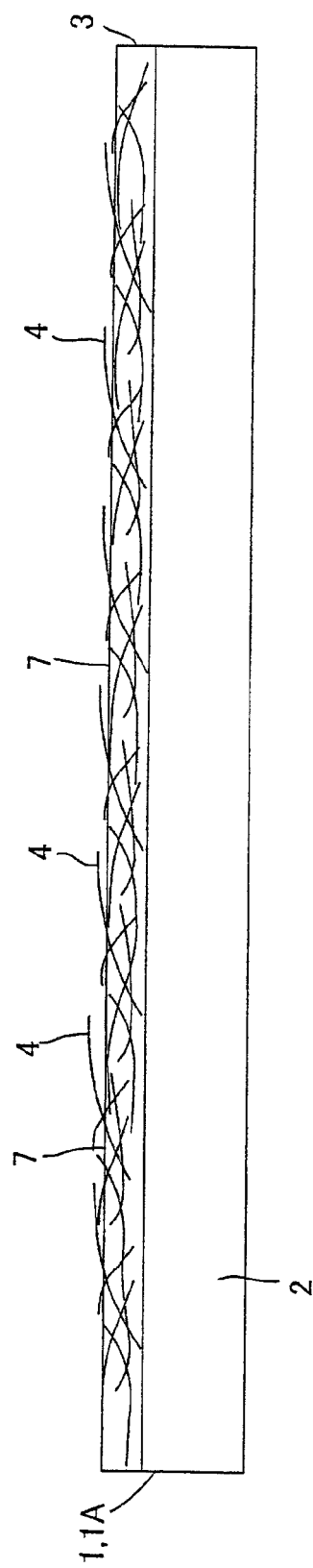
FIG. 2 is an illustrative view schematically showing first and second bases in the embodiment of the capacitive sensor sheet according to the present invention.
Figure 5:
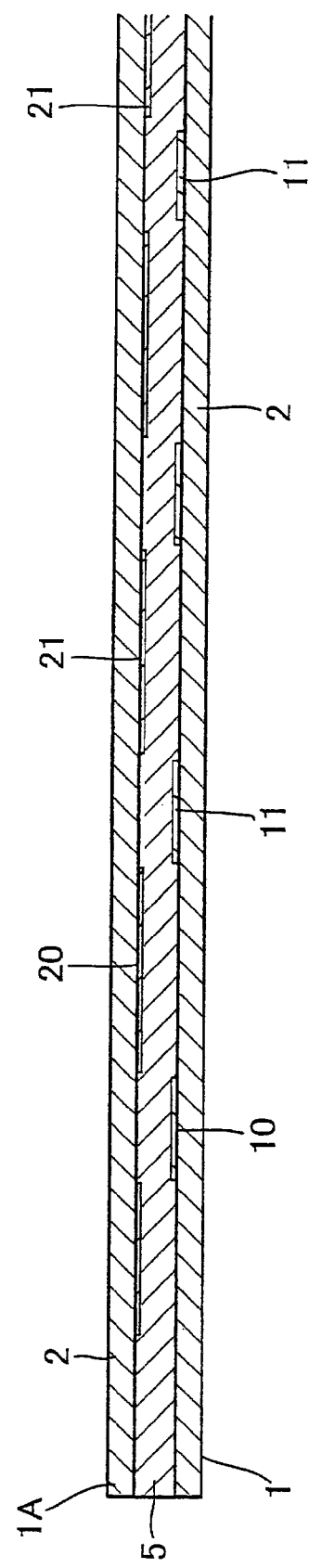
FIG. 5 is an illustrative sectional view schematically showing the embodiment of the capacitive sensor sheet according to the present invention.

As shown in FIGS. 1, 2 and 5, first and second bases 1 and 1A each have an insulative base layer 2 and a binder resin layer 3 laminated on the surface of this base layer 2, wherein conductive and low-resistance silver nanowires 4 are projected out of this binder resin layer 3, and the first and second bases 1 and 1A are laid over each other and bonded and fixed by an insulative adhesive sheet 5.

First base 1 opposing to and located under second base 1A has an elongate tail section 6 projectively formed from the rear periphery of base layer 2, so that this tail section 6 is detachably connected to a control device by means of an electric connector. Second base 1A opposing to and located over second base 1 has an elongate tail section 6 projectively formed from the rear periphery of base layer 2, so that this tail section 6 is detachably connected to the control device by means of an electric connector.

Figure 3:
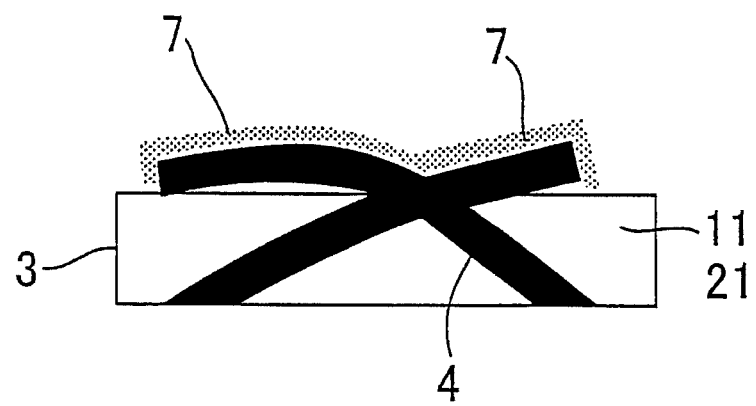
FIG. 3 is a partial illustrative view schematically showing projections of silver nanowires partially projecting from a binder resin layer, X-detection electrode or Y-detection electrode in an embodiment of a capacitive sensor sheet producing method and the capacitive sensor sheet according to the present invention.
Figure 4:
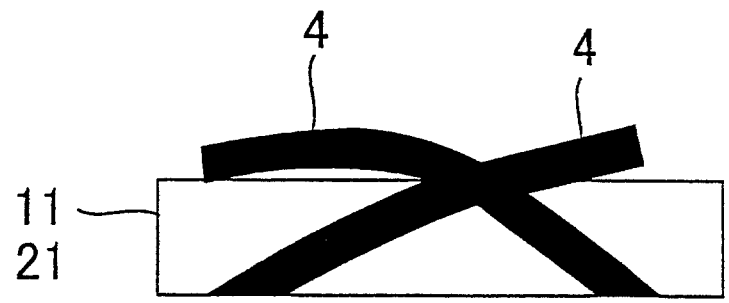
FIG. 4 is a partial illustrative view schematically showing a state where the binder resin over the projections of silver nanowires in FIG. 3 has been removed.

As shown in FIGS. 2 and 3, each base layer 2 has a laterally long rectangular shape in top view and formed of a transparent film or the like of, for example polyethylene terephthalate or polycarbonate which are excellent in heat resistance and strength.

Binder resin layer 3 is formed of a resin such as, for example acrylic resin, epoxy resin and polyimide resin, laminated on the surface of base layer 2 by applying a binder resin solution impregnated with numerous silver nanowires 4, over the surface of base layer 2 and then drying and curing so as to function to fix silver nanowires 4 on base layer 2. As shown in FIG. 3, silver nanowires 4 partly project, at random, from the surface of the dried and cured binder resin layer 3. Binder resin 7 of binder resin layer 3 adheres to the projections, forming an insulative coating. The thus formed binder resin layer 3 is processed by laser shaping and the like in the course of producing the capacitive sensor sheet, to form part of X-pattern layer 10 or Y-pattern layer 20.

Formation of the lamination of binder resin layer 3 may be mostly performed by application of the binder resin solution with silver nanowires 4 as conductive ultra fine fibers dispersed therein, but should not be particularly limited. For example, it is possible to form a lamination of binder resin layer 3 with silver nanowires 4 networked therein by coating a dispersion liquid containing silver nanowires 4 over the whole surface of base layer 2 and drying so as to temporarily fix the network of silver nanowires 4 on the whole surface of base layer 2, then applying a transparent insulative base material fluid, specifically, a binder resin such as acrylic resin or the like, over silver nanowires 4 in order to protect the silver nanowires 4, and curing the binder resin by heating or irradiating ultraviolet rays or electron beams.

Adhesive sheet 5 is preferably transparent, and may employ a double-sided tape having a transparent adhesive material such as acrylic resin on both sides of a transparent base sheet made of polyethylene terephthalate or acrylic resin, or a (baseless) adhesive tape having no base, and is sandwiched between base layers 2 of opposing first and second bases 1 and 1A to adhesively fix these.

Figure 7:
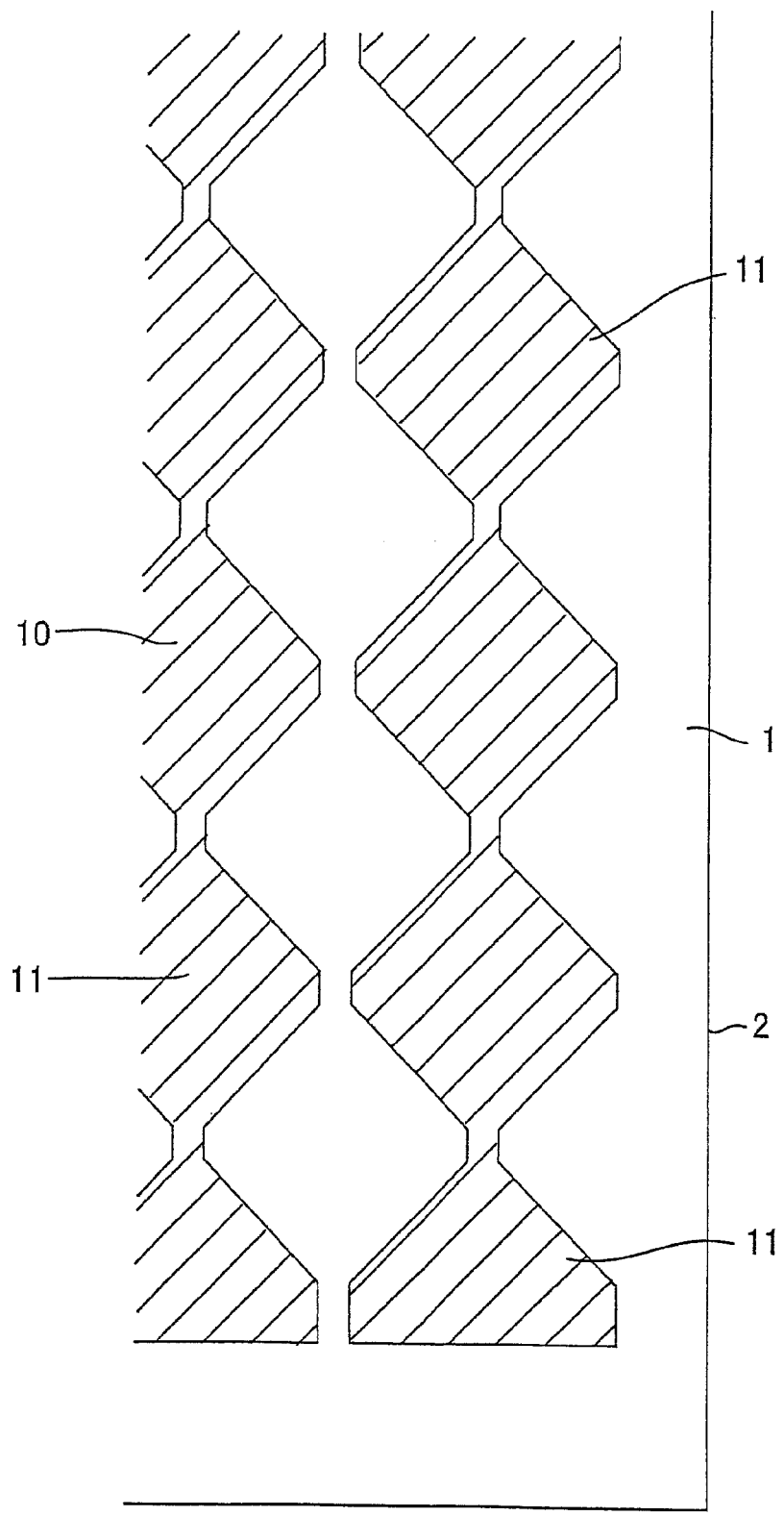
FIG. 7 is an illustrative partial plan view schematically showing an X-pattern layer in the embodiment of the capacitive sensor sheet according to the present invention.

As shown in FIGS. 1, 5 and 7, X-pattern layer 10 is formed with a plurality of X-detection electrodes 11 aligned in the Y-direction and wiring lines 12 for these plurality of X-detection electrodes 11. The plurality of X-detection electrodes 11 are arranged in one row in the Y-direction on the surface of base layer 2 of first base 1, and arrayed in the X-direction with a predetermined pitch. Most of the plurality of X-detection electrodes 11 are formed of a thin film of an approximately diamond shape in top view while the remaining part of X-detection electrodes 11 located at both ends of each row are formed of a thin film of an approximately half diamond shape in top view.

Among the plurality of X-detection electrodes 11 aligned on the surface in the Y-direction, the surface end of terminal X-detection electrode 11 in the row is connected with one end of elongate low-resistance conductive wiring line 12 by laying the wiring line over the electrode, this wiring line 12 being extended to tail section 6 of first base 1 and electrically connected to the control device.

The thus formed X-pattern layer 10 is formed with the plurality of X-detection electrodes 11 having conductivity by shaping binder resin layer 3 in first base 1 while a conductive material such as silver paste is screen printed or gravure printed on the base layer 2 surface of first base 1 to form a plurality of wiring lines 12 by drying and curing.

In this case, the surface ends of, at least, the terminal X-detection electrodes 11, among the plurality of X-detection electrodes 11, to which the end of wiring line 12 is connected, are shaped by a surface etching treatment in order to assure beneficial conduction with wiring line 12. As this surface etching and shaping treatment, dry etching methods including plasma treatment technique, ultraviolet ray treatment technique, corona treatment technique, laser treatment technique, blasting technique and the like, and wet etching methods can be considered.

Though either the dry etching method or the wet etching method may be used, use of the dry etching method is preferable because the wet etching method needs disposal of the etching liquid and masking. Among the dry etching method, the plasma treatment technique, ultraviolet ray treatment technique and corona treatment technique are preferred in view of preventing unnecessary damage and improving the speed of the job.

When the plasma treatment technique in the dry etching method is used for the surface etching and shaping treatment, it is possible to expect advantages in direct plasma etching and reactive ion etching. It should be noted that adoption of reactive ion etching makes it possible to make the processing conditions (processing time) wide.

The power in plasma processing is preferably set in a range of 0.01 to 0.5 W/cm$^2$. This is because if the processing power is less than 0.01 W/cm$^2$, no advantage of the surface etching and shaping can be recognized, whereas if the power exceeds 0.5 W/cm$^2$, silver nanowires 4 in binder resin layer 3 are damaged to markedly increase the resistance. Here, W/cm$^2$ represents power per unit area of the electrode of the processing device.

The process of the plasma treatment technique is preferably implemented 30 seconds to 5 minutes in a case of direct plasma, and 30 seconds to 10 minutes in a case of reactive ion etching. This is because the processing time s shorter than the above range makes it impossible to obtain sufficient advantage of the surface etching and shaping, whereas the processing time longer than the above range will damage silver nanowires 4 in binder resin layer 3 to markedly increase the resistance. The processing gas for plasma treatment, oxygen, argon, a mixture of oxygen and argon, and others can be used. Of these, use of argon gas which can eliminate the fear of oxidation of silver nanowires 4 is most suitable.

When an ultraviolet ray treatment technique is used, use of a low-pressure mercury lamp (having a wavelength of 185 nm or 254 nm, for example) for the light source for irradiation of ultraviolet rays is preferred because a high-pressure mercury lamp (having a wavelength of 365 nm) is low in power so that it is not suitable for the surface etching and shaping treatment of the overcoat of binder resin layer 3.

The irradiation power of ultraviolet rays is preferably set in a range of 10 to 300 mW/cm$^2$. This is because an irradiation power of ultraviolet rays less than 10 mW/cm$^2$ can produce no advantage whereas an irradiation power of ultraviolet rays exceeding 300 mW/cm$^2$ will give rise to a risk of damaging silver nanowires 4 in binder resin layer 3 to markedly increase the resistance and/or changing base layer 2 and the overcoat layer in color (into yellow).

When a corona treatment technique is adopted, the distance from the electrode of the processing device to silver nanowires 4 is preferably kept within a range of 1 to 10 mm. This is because a distance less than 1 mm will cause damage to silver nanowires 4 to markedly increase the resistance whereas a distance exceeding 10 mm cannot produce sufficient advantage. Further, the processing power is preferably set in a range of 0.2 to 20 W/cm. This is because a processing power less than 0.2 W/cm cannot produce any advantage whereas a power exceeding 20 W/cm will cause damage to silver nanowires 4 to markedly increase the resistance. Here, W/cm represents power per unit length of the electrode.

In implementing a corona treatment, X-pattern layer 10 is relatively moved so as to process a plurality of X-detection electrodes 11 every row. This treatment is preferably performed at a speed of 0.1 to 20 m/min. This is because a speed higher than this cannot produce sufficient advantage whereas a speed lower than this will cause damage to silver nanowires 4 to markedly increase the resistance.

When a wet etching method is adopted for the surface etching and shaping process, use of water or an aqueous solution as an etching liquid is preferable if the composition of the binder resin is water-soluble. In contrast, if the composition of the binder resin is insoluble in water, an organic solvent having a solubility parameter similar to that of the binder resin may be used while the concentration, immersion temperature and immersion time may be adjusted as appropriate depending on the material and the thickness. The wet etching method includes dipping technique, spray technique and spin technique, and adoption of the dipping technique which is the simplest is the best.

Figure 8:
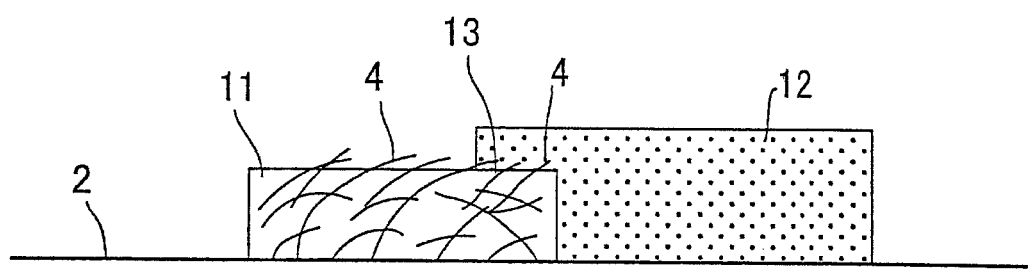
FIG. 8 is an illustrative view schematically showing a connecting portion between a terminal X-detection electrode and a wiring line in the embodiment of the capacitive sensor sheet according to the present invention.

The silver nanowires 4 partially projected from the surface end of terminal X-detection electrode 11 are enlarged in projected area by the above-described surface etching and shaping process and removed insulative binder resin 7 having adhered to the projections so as to secure conduction and come into electrical contact with connecting portion 13 between terminal X-detection electrode 11 and wiring line 12 as auxiliary electrodes (see FIG. 8).

Figure 6:
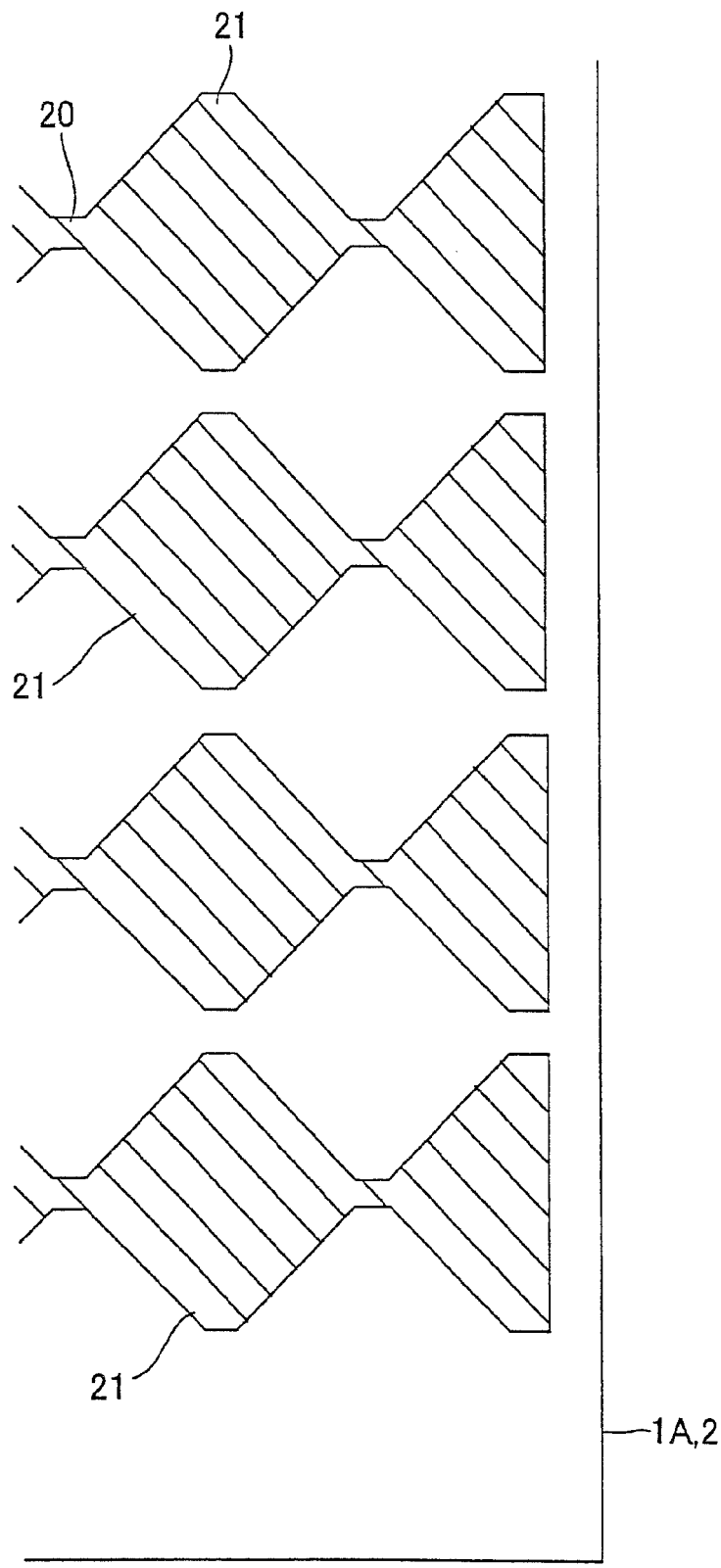
FIG. 6 is an illustrative partial plan view schematically showing a Y-pattern layer in the embodiment of the capacitive sensor sheet according to the present invention.

As shown in FIGS. 1, 5 and 6, Y-pattern layer 20 is formed with a plurality of Y-detection electrodes 21 aligned in the X-direction and wiring lines 22 for these plurality of Y-detection electrodes 21. The plurality of Y-detection electrodes 21 are arranged in one row in the X-direction on the surface of second base 1A that opposes the first base 1 surface, and arrayed in the Y-direction with a predetermined pitch. Most of the plurality of Y-detection electrodes 21 are formed of a thin film of an approximately diamond shape in top view, whereas the remaining part of Y-detection electrodes 21 located at the ends of each row is formed of a thin film of an approximately half diamond shape in top view.

Among the plurality of Y-detection electrodes 21 aligned on the surface in the X-direction, the surface end of terminal Y-detection electrode 21 is electrically connected with elongate conductive low-resistance wiring line 22 by laying the wiring line over the electrode. This wiring line 22 is extended from the surface of base layer 2 in second base 1A to the rear side or the top surface via a through-hole and exposed. The exposed wiring line 22 is extended to tail section 6 and electrically connected to the control device.

The thus formed Y-pattern layer 20 is formed with the plurality of Y-detection electrodes 21 having conductivity by shaping binder resin layer 3 in second base 1A while a conductive material such as silver paste is screen printed or gravure printed on the base layer 2 surface of second base 1A to form a plurality of wiring lines 22 by drying and curing.

In this case, the surface ends of, at least, the terminal Y-detection electrodes 21 among the plurality of Y-detection electrodes 21 to which the end of wiring line 22 is connected, are shaped by a surface etching and shaping treatment similarly to the terminal X-detection electrodes 11, in order to assure beneficial conduction with wiring line 22. By this surface etching and shaping process, the silver nanowires 4 partially projected from the surface end of the terminal Y-detection electrode 21 are enlarged in projected area and removed the insulative binder resin 7 having adhered to the projections so as to secure conduction and come into electrical contact with connecting portion 23 between terminal Y-detection electrode 21 and wiring line 22 as auxiliary electrodes.

In the above configuration, when the capacitive sensor sheet is produced, first of all, base layer 2 of a predetermined size is prepared in order to form first base 1. The whole surface of this base layer 2 is applied with a binder resin solution with silver nanowires 4 dispersed therein by a coater and then dried and cured so that a lamination of binder resin layer 3 is formed while part of silver nanowires 4 are made to randomly projected from the surface of this binder resin layer 3 to complete first base 1.

The binder resin solution can be prepared, for example by dissolving binder resin 7 into a predetermined solvent and then uniformly dispersing numerous silver nanowires 4. Second base 1A is also produced by repeating the same process as that for first base 1.

Next, the binder resin layer 3 on first base 1 is shaped to form the plurality of X-detection electrodes 11 of X-pattern layer 10, and then the surface ends of the terminal X-detection electrodes 11 are shaved off by a surface etching and shaping treatment such as a plasma treatment (e.g., shaving off about 10 nm) to remove binder resin 7 from the projections of silver nanowires 4 partially projected from the surface ends. In this process, the area other than the surface ends of terminal X-detection electrodes 11 needs to be masked. However, if it is wanted to save time and labor for masking to improve operativity, the surface etching and shaping treatment may be implemented on the whole surface of the plurality of X-detection electrodes 11.

After removal of binder resin 7 in the above way, silver paste or the like is printed on the surface of base layer 2 of first base 1 to form wiring lines 12, and the ends of wiring lines 12 are laid over and connected to the surface ends of terminal X-detection electrodes 11 while the projections of silver nanowires 4 partially projected from the surface of terminal X-detection electrode 11 are put into contact with the connecting portion 13.

Similarly to the above, the binder resin layer 3 on second base 1A is shaped to form the plurality of Y-detection electrodes 21 of Y-pattern layer 20, and then the surface ends of the terminal Y-detection electrodes 21 are shaved off by a surface etching and shaping treatment (e.g., shaving off about 10 nm) to remove binder resin 7 from the projections of silver nanowires 4 partially projected from the surface. In this process, similar to X-pattern layer 20, in order to save time and labor for masking to improve operativity, the surface etching and shaping treatment may be implemented on the whole surface of the plurality of Y-detection electrodes 21.

After removal of binder resin 7, silver paste or the like is printed on the surface of base layer 2 of second base 1A to form wiring lines 22, and the ends of wiring lines 22 are laid over and connected to the surface ends of terminal Y-detection electrodes 21 while the projections of silver nanowires 4 partially projected from the surface of terminal Y-detection electrode 21 are put into contact with the connecting portion 23.

After X-pattern layer 10 and Y-pattern layer 20 have been formed on base layers 2 of first and second bases 1 and 1A, respectively, these first and second bases 1 and 1A are put together with their patterned faces opposing each other and adhesively fixed to each other by sticky adhesive sheet 5. Then, a transparent protective cover 30 is adhered and laminated on the exposed top surface of, at least, second base 1A, of first and second bases 1 and 1A. The resultant lamination is slid and pressurized by a rotary roller so as to be closely adhered and then cut into a predetermined size to produce a capacitive sensor sheet.

The thus formed capacitive sensor sheet is assembled as a control means to, for example an automobile-mounted device. As a user's finger comes close to and opposes a selected X-detection electrode 11 of X-pattern layer 10 or Y-detection electrode 21 of Y-pattern layer 20, the capacitance between the electrode and the user's finger changes so that this change in capacitance is detected and output to the control device, to thereby contribute to the operation of the automobile-mounted device.

According to the above, the area and number of low-resistance silver nanowires 4 being exposed increase to provide the function of auxiliary electrodes. Since the silver nanowires 4 contribute to electric conduction, there is no fear of the conductivity in connecting portions 13 and 23 between terminal X-detection electrodes 11 and Y-detection electrodes 21, and wiring lines 12 and 22, being degraded or the contact resistance being increased or unstabilized.

Instead of exposing the projections of silver nanowires 4 by decreasing the volume of the binder resin solution, at least binder resin 7 adhering to silver nanowires 4 is removed by performing the surface etching and shaping treatment over the surface of binder resin layer 3, so that it is possible to positively secure the conduction of silver nanowires 4. Further, use of fine silver nanowires 4 will not give any adverse effect even when the capacitive sensor sheet is required to be transparent. Moreover, measurement of resistance can be really easily done by putting a probe in contact with the surface of binder resin layer 3.

Though in the above embodiment the surface etching and shaping treatment on X-pattern layer 10 and/or Y-pattern layer 20 is carried out after shaping of binder resin layer 3, the process should not be limited to this. For example, the surface etching and shaping treatment on the surface of binder resin layer 3 may be done before shaping binder resin layer 3, then the binder resin layer 3 may be shaped to form X-pattern layer 10 and/or Y-pattern layer 20.

Also, the embodiment shown above is a simple configuration that includes the plurality of X-detection electrodes 11 and Y-detection electrodes 21. However, if the clearances between the plurality of X-detection electrodes 11 and the clearances between the plurality of Y-detection electrodes 21 are filled up with dummy X electrodes and dummy Y electrodes having the same shape, it is possible to markedly reduce the etching and shaping area. In this case, it is not necessary to remove binder resin 7 across the wide range, whereby it is possible to accelerate and simplify the producing operation, and it is yet possible to cut down waste of materials and the like.

Further, as required, the surface of terminal X-detection electrodes 11 and their peripheral area may be processed by surface etching and shaping, or the surface of all X-detection electrodes 11 and their peripheral area may be processed by surface etching and shaping. Also, the surface of terminal Y-detection electrodes 21 and their peripheral area may be processed by surface etching and shaping, or the surface of all Y-detection electrodes 21 and their peripheral area can be processed by surface etching and shaping.

EXAMPLES

Next, examples of the present invention will be described with a comparative example.

Example 1

A test capacitive sensor sheet was prepared, and the surface ends of the detection electrodes of the pattern layers were surface etched and shaped by the plasma treatment technique. Then, wiring lines were laid over and connected to the surface ends of the detection electrodes processed by surface etching and shaping, and the conductivity between the surface end of the detection electrode and the wiring line was measured.

The test capacitive sensor sheet was produced by preparing first and second bases of 20 cm wide, forming an X-pattern layer on the base layer of the first base, adhering and fixing the first and second bases opposing each other with a sticky adhesive sheet, pressing and sliding rotary rubber roller of 30 cm wide on the first and second bases to thereby pressurize the first and second bases and the adhesive sheet to closely adhere to one another, then cutting the sheet into a predetermined size.

Each base layer was formed of a laterally long rectangle, viewed from top, of a transparent polyethylene terephthalate film. The binder resin layer was formed using acrylic resin as the binder resin, into which numerous silver nanowires were dispersed. The X-pattern layer was formed by forming twelve continuous strips arranged abreast in the Y-direction by etching and shaping the binder resin layer of the first base. These twelve strips were regarded as the plurality of X-detection electrodes, and both surface ends of each X-detection electrode were surface-etched and shaped by using a direct plasma treatment technique and wiring lines of silver paste were laid over on both the surface ends of each X-detection electrode and printed.

Each X-detection electrode was formed to measure 150 mm long, 5 mm wide and 30 nm thick. The contact area between the end of the surface of each X-detection electrode and the wiring line was set to measure 1.8 mm$^2$ (0.4×4.5 mm=1.8 mm$^2$). The direct plasma treatment technique was performed using argon gas as a processing gas, under the condition that a processing output power is set to 0.02 W/cm$^2$ and processing time is set to 3 minutes.

The rubber roller pressed and slid 10 times at a rolling rate of 30 cm/sec. In pressing with this rubber roller, a pressure of 5 to 10 kg was applied across the line width of 30 cm. As to conductivity, before pressing with the rubber roller, the resistance (kΩ) between a pair of wiring lines was measured, and this measured value was regarded as the initial resistance (kΩ) in the connecting portion between the surface end of the X-detection electrode and the wiring line.

After pressing and sliding 10 times with the rubber roller, the resistance (kΩ) between the pair of wiring lines was also measured, and this measured value was regarded as the resistance (kΩ) in the connecting portion between the surface end of the X-detection electrode and the wiring line. Then, from these resistance values, the ratio of change (%) in resistance between before and after pressing with the rubber roller was calculated. Further, from the measured values, the mean, the maximum value, the minimum value and the standard deviation were calculated. The conductivity was thus measured and the result was summarized in Table 1.

TABLE 1

|   | Initial Resistance Value | Resistance Value after pressing 10 times with rubber roller | Change Ratio |
|---|---|---|---|
| 1 | 2.50 | 2.51 | 0.40% |
| 2 | 2.59 | 2.59 | 0.00% |
| 3 | 2.57 | 2.58 | 0.39% |
| 4 | 2.60 | 2.60 | 0.00% |
| 5 | 2.62 | 2.63 | 0.38% |
| 6 | 2.63 | 2.64 | 0.38% |
| 7 | 2.64 | 2.64 | 0.00% |
| 8 | 2.66 | 2.66 | 0.00% |
| 9 | 2.64 | 2.65 | 0.38% |
| 10 | 2.70 | 2.70 | 0.00% |
| 11 | 2.70 | 2.70 | 0.00% |
| 12 | 2.63 | 2.63 | 0.00% |
| Mean | 2.62 | 2.63 | 0.16% |
| Maximum Value | 2.70 | 2.70 | 0.40% |
| Minimum Value | 2.50 | 2.51 | 0.00% |
| Standard Deviation | 0.06 | 0.05 | 0.20% |

(kΩ)

Example 2

A test capacitive sensor sheet was prepared, and the surface ends of the X-detection electrodes of the X-pattern layer were surface etched and shaped by an ultraviolet ray treatment technique. Then, wiring lines were laid over and connected to the surface ends of the surface-etched and shaped X-detection electrodes, and the conductivity between the surface end of the X-detection electrode and the wiring line was measured.

The test capacitive sensor sheet was produced in the same configuration as that of Example 1. The ultraviolet ray treatment technique was performed using a processing device sold on the market, with a low-pressure mercury lamp for the light source under the condition that illuminance of ultraviolet ray is set to 200 mW/cm$^2$ and processing time is set to 2 minutes.

The conductivity was measured in the same manner as in Example 1 and the result was summarized in Table 2.

TABLE 2

|   | Initial Resistance Value | Resistance Value after pressing 10 times with rubber roller | Change Ratio |
|---|---|---|---|
| 1 | 2.50 | 2.53 | 1.20% |
| 2 | 2.78 | 2.79 | 0.36% |
| 3 | 2.54 | 2.56 | 0.79% |
| 4 | 2.68 | 2.69 | 0.37% |
| 5 | 2.59 | 2.60 | 0.39% |

TABLE 2-continued

|  | Initial Resistance Value | Resistance Value after pressing 10 times with rubber roller | Change Ratio |
| --- | --- | --- | --- |
| 6 | 2.55 | 2.55 | 0.00% |
| 7 | 2.64 | 2.64 | 0.00% |
| 8 | 2.70 | 2.71 | 0.37% |
| 9 | 2.64 | 2.66 | 0.76% |
| 10 | 2.58 | 2.60 | 0.78% |
| 11 | 2.61 | 2.63 | 0.77% |
| 12 | 2.60 | 2.62 | 0.77% |
| Mean | 2.62 | 2.63 | 0.55% |
| Maximum Value | 2.78 | 2.79 | 1.20% |
| Minimum Value | 2.50 | 2.53 | 0.00% |
| Standard Deviation | 0.08 | 0.07 | 0.36% |

(kΩ)

Example 3

A test capacitive sensor sheet was prepared, and the surface ends of the X-detection electrodes of the X-pattern layer were surface etched and shaped by the corona treatment technique. Then, wiring lines were laid over and connected to the surface ends of the surface-etched and shaped X-detection electrodes, and the conductivity between the surface end of the X-detection electrode and the wiring line was measured.

The test capacitive sensor sheet was produced in the same configuration as that of Example 1. The corona treatment technique was performed using a processing device sold on the market, with an output power of 6 W under the condition that a relative speed for moving over the plurality of X-detection electrodes is set to 6 m/min and the distance from the electrode of the processing device to the silver nanowires is set to 4 mm.

The conductivity was measured in the same manner as in Example 1 and the result was summarized in Table 3.

TABLE 3

|  | Initial Resistance Value | Resistance Value after pressing 10 times with rubber roller | Change Ratio |
| --- | --- | --- | --- |
| 1 | 2.61 | 2.67 | 2.30% |
| 2 | 2.60 | 2.64 | 1.54% |
| 3 | 2.54 | 2.56 | 0.79% |
| 4 | 2.62 | 2.64 | 0.76% |
| 5 | 2.57 | 2.59 | 0.78% |
| 6 | 2.56 | 2.59 | 1.17% |
| 7 | 2.56 | 2.56 | 0.00% |
| 8 | 2.65 | 2.66 | 0.38% |
| 9 | 2.65 | 2.66 | 0.38% |
| 10 | 2.56 | 2.59 | 1.17% |
| 11 | 2.60 | 2.61 | 0.38% |
| 12 | 2.62 | 2.63 | 0.38% |
| Mean | 2.60 | 2.62 | 0.84% |
| Maximum Value | 2.65 | 2.67 | 2.30% |
| Minimum Value | 2.54 | 2.56 | 0.00% |
| Standard Deviation | 0.04 | 0.04 | 0.63% |

(kΩ)

Comparative Example

A test capacitive sensor sheet was prepared, and no surface etching and shaping treatment was performed on the surface ends of the X-detection electrodes of the X-pattern layer. Then, wiring lines were laid over and connected to the surface ends of the untreated X-detection electrodes, and the conductivity between the surface end of the X-detection electrode and the wiring line was measured.

The configuration of capacitive sensor sheet and the conductivity were set to the same as those in Examples and after the conductivity was measured, the result was summarized in Table 4.

TABLE 4

|  | Initial Resistance Value | Resistance Value after pressing 10 times with rubber roller | Change Ratio |
| --- | --- | --- | --- |
| 1 | 2.92 | 3.56 | 21.92% |
| 2 | 3.20 | 3.19 | −0.31% |
| 3 | 3.78 | 3.51 | −7.14% |
| 4 | 2.87 | 2.87 | 0.00% |
| 5 | 2.99 | 3.56 | 19.06% |
| 6 | 2.99 | 4.25 | 42.14% |
| 7 | 2.87 | 5.03 | 75.26% |
| 8 | 2.90 | 4.15 | 43.10% |
| 9 | 2.90 | 2.90 | 0.00% |
| 10 | 2.91 | 2.91 | 0.00% |
| 11 | 2.98 | 3.28 | 10.07% |
| 12 | 4.46 | 5.00 | 12.11% |
| Mean | 3.15 | 3.68 | 18.02% |
| Maximum Value | 4.46 | 5.03 | 75.26% |
| Minimum Value | 2.87 | 2.87 | −7.14% |
| Standard Deviation | 0.49 | 0.76 | 24.39% |

(kΩ)

According to Examples 1, 2 and 3, the conductivity in the connecting portion between the X-detection electrode and the wiring line was improved, so that markedly beneficial mean, maximum value, minimum value and standard deviation could be obtained. As a result, it was found that the examples make it possible to stabilize the initial resistance value, inhibit change in resistance and effectively eliminate the fear of the contact resistance being increased or unstabilized.

In contrast to this, according to the comparative example corresponding to the prior art example, because no surface-etching and shaping treatment had been implemented, there occurred some cases that the initial resistance value was unstable regardless of whether or not the sheet was pressured and slid with a rubber roller. Further, comparing with the examples, satisfying mean, maximum value, minimum value and standard deviation could not be obtained. From this comparative example, it became apparent that the conductivity in the connection portion between the X-detection electrode and the wiring line degrades, causing increase and instability of the resistance.

INDUSTRIAL APPLICABILITY

The capacitive sensor sheet producing method and the capacitive sensor sheet according to the present invention can be used in the fields of audio devices, household electrical appliances, mobile information devices, automobile-mounted devices and the like, for example.

DESCRIPTION OF REFERENCE NUMERALS 1 first base (base)
1A second base (base)
2 base layer
3 binder resin layer
4 silver nanowires (conductive nanowires)
7 binder resin 10 X-pattern layer (pattern layer)
11 X-detection electrode (detection electrode)
12 wiring line
13 connecting portion
20 Y-pattern layer (pattern layer)
21 Y-detection electrode (detection electrode)
22 wiring line
23 connecting portion

The invention claimed is:

1. A capacitive sensor sheet producing method for producing a capacitive sensor sheet by using a base having an insulative base layer on which a binder resin layer including conductive nanowires is formed, the conductive nanowires partially projecting from a surface of the binder resin layer, comprising the steps of:
when a plurality of detection electrodes of a conductive pattern layer are formed by shaping a binder resin layer of a base, removing a binder resin from projections of conductive nanowires partially projected from surface ends of at least partial detection electrodes of the plurality of detection electrodes by implementing a surface etching and shaping treatment on the surface ends, the conductive nanowires partially projected from the surface ends having an adhering area of the binder resin and an exposing area of the conductive nanowire before the surface etching and shaping treatment;
forming wiring lines of the conductive pattern layer by applying a conductive material on an insulative base layer of the base and drying and curing the applied conductive material; and,
connecting the wiring lines to the projections of the conductive nanowires of the surface ends, the projections having more exposing area than that before the surface etching and shaping treatment.

2. The capacitive sensor sheet producing method according to claim 1, wherein the surface etching and shaping treatment is carried out by either a dry etching method or a wet etching method.

3. The capacitive sensor sheet producing method according to claim 1, wherein the surface etching and shaping treatment is carried out by either plasma treatment technique, ultraviolet ray treatment technique, or corona treatment technique.

4. The capacitive sensor sheet producing method according to claim 1, wherein a surface of all the detection electrodes in the pattern layer is subjected to the surface etching and shaping treatment.

5. The capacitive sensor sheet producing method according to claim 1, wherein a surface of the detection electrodes to be connected to the wiring lines is subjected to the surface etching and shaping treatment.

6. A capacitive sensor sheet having a conductive pattern layer formed on an insulative base layer and detecting a change in capacitance when a conductor approaches a detection electrode in the conductive pattern layer, wherein
the conductive pattern layer includes:
a plurality of detection electrodes arrayed on the insulative base layer; and
wiring lines formed on the insulative base layer and connected to the plurality of detection electrodes, and
the plurality of detection electrodes is formed by forming a binder resin layer including conductive nanowires on the insulative base layer and shaping the binder resin layer so that the conductive nanowires are partially projected from a surface of the binder resin layer,
conductive nanowires partially projected from at least surface ends of the detection electrodes in the conductive pattern layer to which the wiring lines are connected, have an adhering area of the binder resin and an exposing area of the conductive nanowires,
a binder resin is removed from projections of the conductive nanowires partially projected from the surface ends by implementing a surface etching and shaping treatment on the surface ends, and
the projections of the conductive nanowires having more exposing area than that before the surface etching and shaping treatment are connected to the wiring lines.

7. The capacitive sensor sheet according to claim 6, wherein the surface etching and shaping treatment is carried out by either a dry etching method or a wet etching method.

8. The capacitive sensor sheet according to claim 6, wherein the surface etching and shaping treatment is carried out by either plasma treatment technique, ultraviolet ray treatment technique, or corona treatment technique.

9. The capacitive sensor sheet according to claim 6, wherein a surface of all the detection electrodes of the pattern layer is subjected to the surface etching and shaping treatment.

10. The capacitive sensor sheet according to claim 6, wherein the surface of the detection electrodes to be connected to the wiring lines is subjected to the surface etching and shaping treatment.

11. The capacitive sensor sheet according to claim 6, wherein the base layer is formed of a pair of base layers opposing, and adhering to, each other, one base layer being formed with an X-pattern layer to array a plurality of X-detection electrodes in the X-direction, the other base layer being formed with a Y-pattern layer to array a plurality of Y-detection electrodes in the Y-direction, and at least surface ends of terminal X-detection electrodes which the wiring lines are laid over and connected to, among the plurality of X-detection electrodes in the X-pattern layer, are subjected to the surface etching and shaping treatment while at least surface ends of terminal Y-detection electrodes which the wiring lines are laid over and connected to, among the plurality of Y-detection electrodes in the Y-pattern layer, are subjected to the surface etching and shaping treatment.

* * * * *